(12) United States Patent
Baek

(10) Patent No.: US 8,772,110 B2
(45) Date of Patent: Jul. 8, 2014

(54) SEMICONDUCTOR DEVICE HAVING FIN STRUCTURE AND METHOD OF MANUFACTURING THE SAME

(71) Applicant: SK Hynix Inc., Icheon (KR)

(72) Inventor: Seung Joo Baek, Seoul (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/722,890

(22) Filed: Dec. 20, 2012

(65) Prior Publication Data

US 2013/0320460 A1  Dec. 5, 2013

(30) Foreign Application Priority Data

May 30, 2012  (KR) .......................... 10-2012-0057431

(51) Int. Cl.
H01L 21/336 (2006.01)

(52) U.S. Cl.
USPC ........... 438/270; 438/282; 438/296; 438/423; 257/330; 257/401; 257/510; 257/514; 257/E29.126; 257/E29.27

(58) Field of Classification Search
USPC ............ 257/330, 510, 514, E29.126, E29.27, 257/401; 438/270, 282, 296, 423
See application file for complete search history.

(56) References Cited

U.S. PATENT DOCUMENTS

2004/0235253 A1 * 11/2004 Kim .............................. 438/296
2007/0272954 A1   11/2007 Chen et al.
2010/0001340 A1   1/2010 Lee et al.

FOREIGN PATENT DOCUMENTS

KR  10-2009-0122745 A  12/2009
KR  10-2010-0004649 A  1/2010

* cited by examiner

Primary Examiner — Tu-Tu Ho

(57) ABSTRACT

In a semiconductor device, a thin wall oxide film formed over sidewalls of an active region is formed, and a portion of the wall oxide film adjacent to a gate region is removed. A gate insulating film is formed where the portion of wall oxide film was removed to prevent a parasitic transistor from being generated by the wall oxide film.

13 Claims, 11 Drawing Sheets (i)

(ii)

(i)

(ii)

(i)

(ii)

(i)

(ii)

(i)

(ii)

(a)

(b)

SEMICONDUCTOR DEVICE HAVING FIN STRUCTURE AND METHOD OF MANUFACTURING THE SAME

CROSS-REFERENCE TO RELATED APPLICATION

The present application claims priority to Korean patent application No. 10-2012-0057431, filed on May 30, 2012, which is incorporated by reference in its entirety.

BACKGROUND OF THE INVENTION

Embodiments of the present invention relate generally to a semiconductor device with active regions having a fin structure, and more specifically to a semiconductor device and a method of manufacturing the same not to generate a parasitic transistor while reducing a thickness of a wall oxide film formed at sidewalls of an active region.

As semiconductor devices have become more highly integrated, active regions has been scaled down. As a result, the channel length of transistors formed in the active region has been reduced.

If the channel length of transistors becomes smaller, the size of a channel region also becomes smaller, and short channel effects such as drain induced barrier lowering (DIBL) occur.

Thus, various methods for maximizing the performance of devices while reducing the size of elements formed over a substrate have been researched and developed. One of these various methods is a transistor having a fin structure.

The fin transistor is a transistor with a 3-dimensional channel structure that includes an active region having a protruded channel region, rather than a device isolation film, so that a gate may surround both side surfaces as well as the upper surface of the active region. Through this structure, the channel region is extended so that channels may be formed on three surfaces of the active region (upper surfaces and both side surfaces), thereby improving driving current characteristics.

In such fin structure, the width of the fin is increased in order to increase cell current. One of methods of increasing the width of the fin is to reduce a thickness of an insulating film (wall oxide film) buried in the lower portion of a device isolation film. That is, a space where the device isolation film is formed is determined by the width of the active region and the thickness of the wall oxide film formed over the active region. If the thickness of the wall oxide film is reduced while the space of the device isolation film is maintained, the width of the active region can be increased corresponding to the reduction, thereby increasing the width of the fin.

However, although the cell current is increased when the thickness of the wall oxide film is reduced, the wall oxide film protrudes above the device isolation film around the boundary of the device isolation film and the gate, and the protruded wall oxide film serves as a gate insulating film. In such a device, since the thickness of the wall oxide film is low, a parasitic transistor having a lower threshold voltage than that of the fin transistor is generated around the boundary of the device isolation film and the gate. As a result, the overall threshold voltage of the cell becomes lower.

Accordingly, it is desirable to establish a new method for reducing the thickness of the wall oxide film without generating a parasitic transistor.

BRIEF SUMMARY OF THE INVENTION

Various embodiments of the present invention are directed to preventing a threshold voltage of a cell transistor from being lowered by a parasitic transistor by implanting a inert gas into a wall oxide film to remove the wall oxide film adjacent to a gate region and form a gate insulating film at the removed location.

Various embodiments of the present invention are also directed to improving an operating characteristic of the semiconductor device by selectively extending only a width of a gate adjacent to an active region in the gate region.

According to an embodiment of the present invention, a semiconductor device comprises: an active region defined by a device isolation film and the active region having a fin structure protruded in a gate region; a gate formed in the gate region over the fin structure; a wall oxide film located between the device isolation film and the active region; and a gate insulating film located between the gate and the active region, wherein a portion of the gate insulating film is provided below an upper surface of the device isolation film.

The wall oxide film has a thickness thinner than that of the gate insulating film.

An extended portion of the gate is disposed below an upper surface of the device isolation film and extends past a side surface of the fin structure.

The extended portion of the gate covers the portion of the gate insulating film provided below the upper surface of the device isolation film.

According to another embodiment of the present invention, a method of manufacturing a semiconductor device comprises: etching a semiconductor substrate to form a trench for device isolation that defines an active region; forming a wall oxide film having a first thickness in the inner surface of the trench for device isolation; forming a device isolation film in the trench for device isolation; etching the active region and the device isolation film to form a recess with a first depth over the active region and a second depth greater than the first depth over the device isolation film; forming a moat by removing portions of the wall oxide film adjacent to the active region exposed by the recess; forming a gate insulating film having a second thickness over the portion of active region exposed by the recess and the moat; and forming a gate in the recess.

The method further comprises implanting a inert gas into the wall oxide film before forming the device isolation film.

The inert gas includes at least one selected from Ar and F.

The implanting-a-inert gas comprises performing a slant implanting process so that the inert gas may be implanted only into the wall oxide film formed at sidewalls of the trench for the device isolation.

The forming-a-moat comprises performing a cleaning process after forming the recess to remove the wall oxide film protruded rather than the device isolation film around the boundary of the active region and the device isolation film, and the wall oxide film buried in the lower portion of the device isolation film.

The forming-a-gate-insulating-film comprises forming an insulating film in the active region so as to bury the moat.

The forming-a-moat comprises partially removing the device isolation film while removing the wall oxide film so as to extend partially a width of the recess.

The forming-a-moat comprises removing the device isolation film adjacent to the active region exposed by the recess while removing the wall oxide film.

The forming-a-moat comprises: implanting an inert gas into the wall oxide film and the device isolation film adjacent to the active region expose by the recess; and performing a cleaning process on the recess.

The forming-a-moat-comprises forming the width of the moat to be larger than the thickness of the gate insulating film.

The forming-a-gate comprises forming a gate within the recess so as to bury the moat.

The implanting-a-inert gas comprises implanting the inert gas into the side surface as well as the bottom surface of the recess.

The inert gas includes at least one selected from Ar and F.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Figure 1:
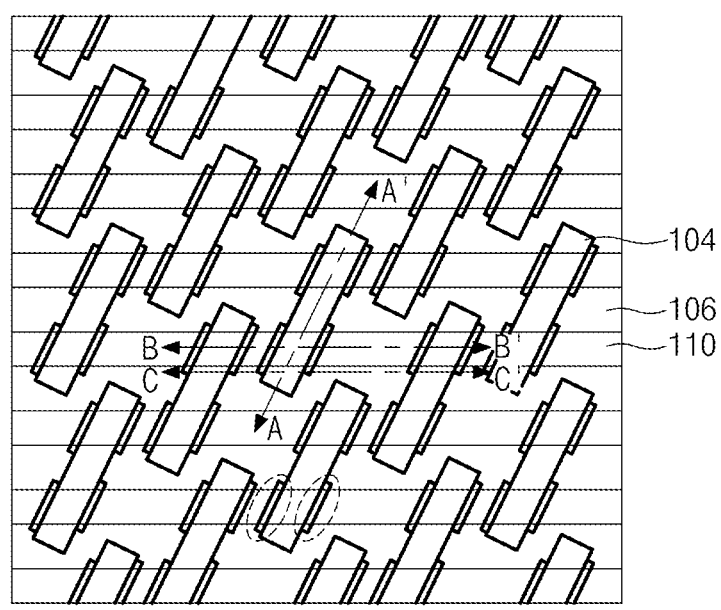
FIG. 1 illustrates a plan view of a semiconductor device according to an embodiment of the present invention.

Embodiments are described herein with reference to illustrations that are schematic illustrations of embodiments of the present invention (and intermediate structures). As such, variations from the shapes of the illustrations as a result, for example, of manufacturing techniques and/or tolerances, are to be expected. Thus, embodiments of the present invention should not be construed as being limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements.

Figure 2:
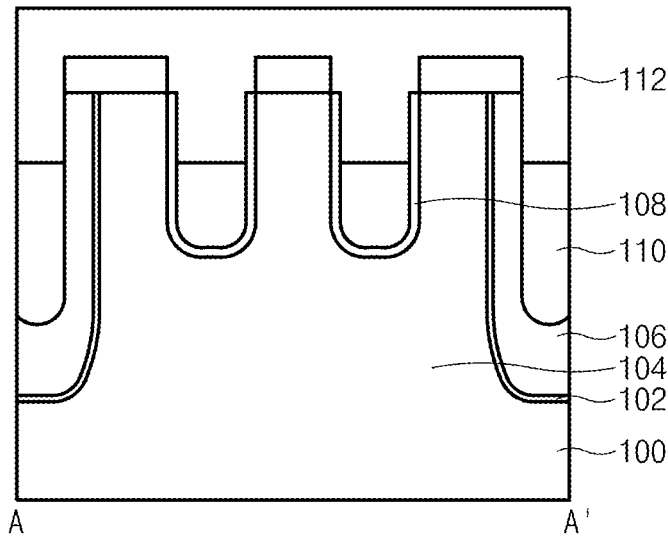
FIG. 2 illustrates cross-sectional views of the embodiment of FIG. 1 taken along A-A' and B-B'.
Figure 2:
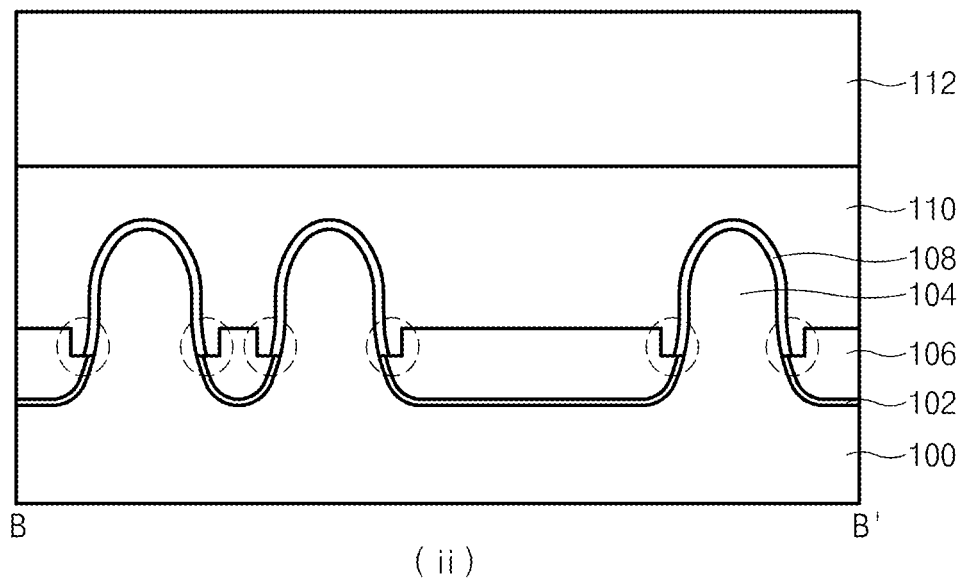

FIG. 1 illustrates a plan view of a semiconductor device according to an embodiment of the present invention, and FIG. 2 illustrates a cross-sectional view of the embodiment of FIG. 1, wherein (i) is a cross-sectional view taken along A-A' and (ii) is a cross-sectional view taken along B-B'.

As shown in the figures, in a cell region of the semiconductor device, a device isolation film 106 that defines an active region 104 is formed over a semiconductor substrate 100, and a gate 110 traverses the active region 104.

Referring to FIG. 1, which represents the cell region including a $6F^2$ unit cell, the active region 104 intersects with the gate 110 at an oblique angle. However, embodiments of the present invention cab be applied to a cell region including $8F^2$ unit cells. Here, F refers to the minimum distance between fine patterns according to a design rule.

In the semiconductor device according to an embodiment of the present invention, the gate 110 may be a buried gate structure buried in the active region 104, or a recess gate structure where a part of the gate 110 is buried in the active region 104 and the other part of the gate 110 protrudes above an upper surface of the active region 104. A channel region having a fin structure is formed in the lower portion of the gate 110.

In accordance with an embodiment of the present invention, a portion of the device isolation film 106 adjacent to the active region 104 in the gate region is etched to increase depth and the width of the gate in a direction transverse to the long axis of the active region. In addition, a moat is formed in the device isolation film 106 where the device isolation film meets active region 104, and the moat is filled with gate material. That is, the width and depth of the gate 110 in the device isolation film 106 are not uniform. A portion of the gate extending over the active region 104 is wider and deeper than a portion of the gate extending over the isolation region 106, and the wider and deeper gate portion extends past the edge of the active region 104 to overlap with a portion of the isolation region 106. In FIG. 1, the thin rectangles inside of the oval dotted lines represent expanded portions of the gate 110. As shown in the dot oval of FIG. 1, the portion of the gate adjacent to the active region 104 is larger than portions of the gate 110 extending through the remainder of the isolation region 106.

As a result, the width of the gate 110 is enlarged in the region where a channel is formed. The enlarged gate portion effectively extends an active region of the semiconductor due to a channel being formed in the enlarged gate portion. The channel length is increased corresponding to the enlargement of the gate, reducing the likelihood of short channel effects.

As shown in FIG. 2, in an embodiment of the present invention, the wall oxide film 102 is thinner than the gate insulating film 108. As shown in the dashed circles in FIG. 2 (ii), at the boundary of the device isolation film 106 and the gate 110, the gate insulating film 108 and the gate 110 are formed so that they may be buried in the device isolation film 106. That is, the thin wall oxide film 102 is not formed between the gate (110) and the active region (104). As a result, a parasitic transistor is not formed by the wall oxide film 102 having a thin thickness. Moreover, an embodiment of the present invention can provide the effect of extending the width of the fin by increasing the area that surrounds the active region 104 by the gate 110.

The wall oxide film 102 includes an oxide material. A capping insulating film 112 for insulating the gate 110 is formed over the gate 110.

FIGS. 3 to 8 illustrate cross-sectional views of a method for fabricating the structure of FIGS. 1 and 2.

Figure 3:
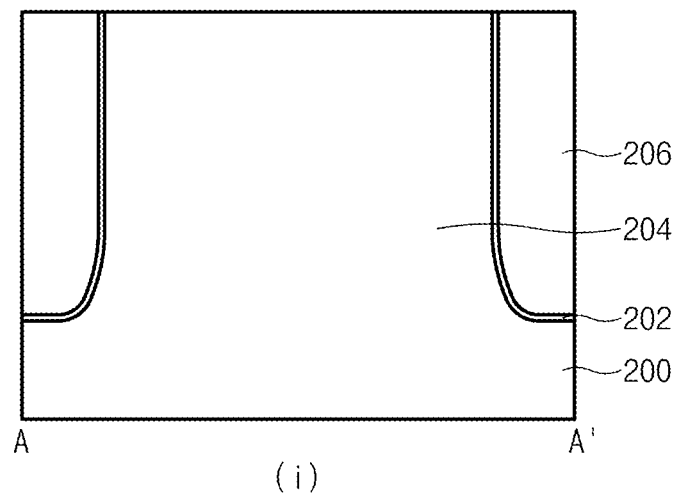
FIGS. 3 to 8 illustrate cross-sectional views of a method for fabricating the embodiment of FIGS. 1 and 2.
Figure 3:
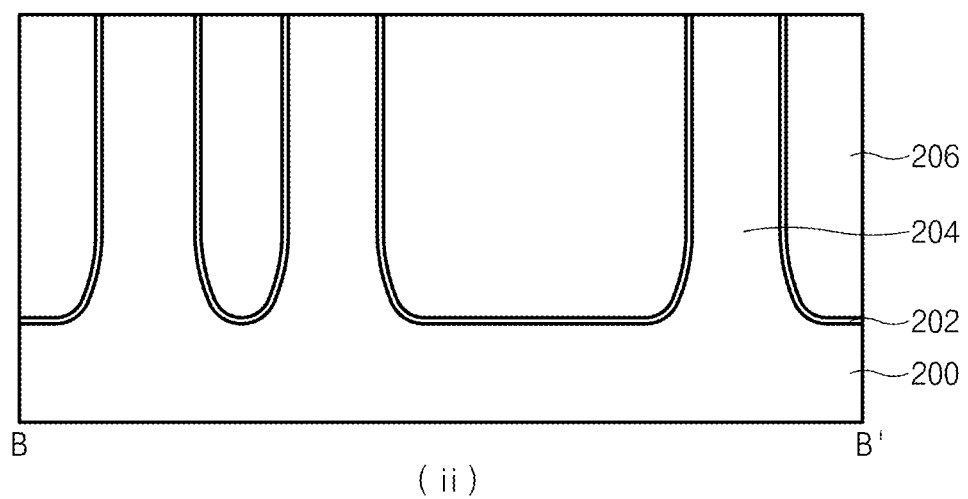

Referring to FIG. 3, a pad oxide film (not shown) and a pad insulating film (not shown) are formed over a semiconductor substrate 200. After a photoresist film is formed over the pad insulating film, a photo etch process using shallow trench isolation (STI) is performed to form a photoresist pattern (not shown) that defines an active region over a pad nitride film.

The pad nitride film and the pad oxide film are sequentially etched with the photoresist pattern to form a mask pattern (not shown). The semiconductor substrate 200 is etched using the mask pattern as an etch mask to form a trench for device isolation (not shown) that defines the active region. Here, the etch process includes a dry etch process.

A wall oxide film 202 is formed on the surface of the semiconductor substrate 200 including the trench for device isolation. The wall oxide film 202 includes an oxide material, which can be formed by an oxidation process.

The wall oxide film 202 may be formed to be relatively thin in order to enlarge the width of the active region 204 without decreasing the space of the trench for device isolation, that is, to enlarge a width of a fin to be formed in a subsequent process. If the space of the trench for device isolation is too narrow, it may be difficult to fully deposit a device isolation film 206 in a subsequent process, which may result in generation of voids. When voids are present, undesirable effects such as a bridge between gates may be generated. Thus, in an embodiment, the wall oxide film 202 is formed to be thin, thereby enlarging the width of the active region 204 while maintaining the space of the device isolation trench.

After an insulating film for device isolation is formed in device isolation trench, the insulating film is etched and planarized to expose the active region 204, thereby obtaining the device isolation film 206 that defines the active region 204. The device isolation film 206 may include a spin on dielectric (SOD) material or a high density plasma (HDP) oxide film with an excellent gap-fill characteristic. In other embodiments, the device isolation film 206 may include a nitride film or a stacked structure including an oxide film and a nitride film.

Although it is not shown, after the device isolation film 206 is formed, ions may be implanted to a given depth into the upper portion of the active region 204 to create source and drain regions.

Figure 4:
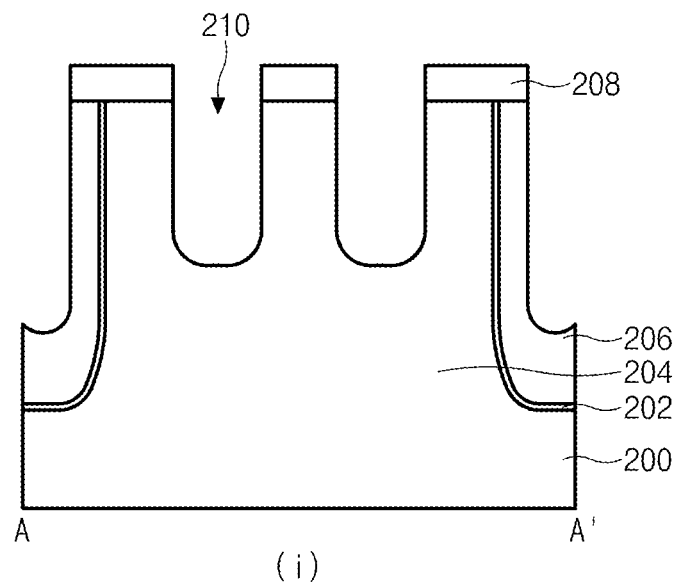
Figure 4:
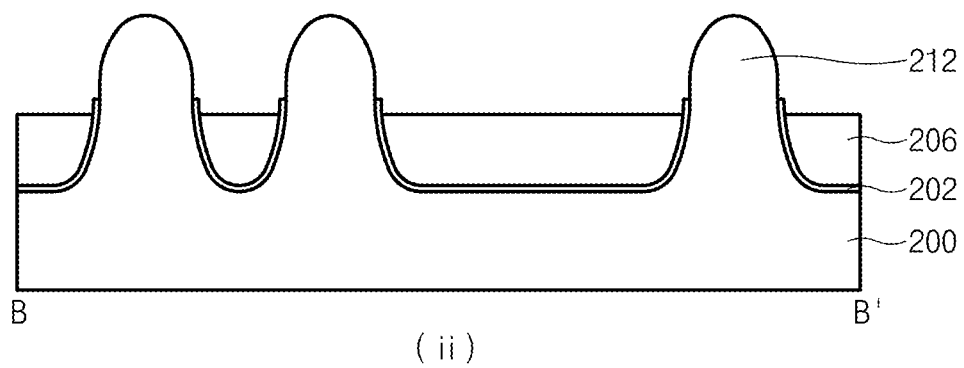

Referring to FIG. 4, after a hard mask layer (not shown) is formed over the active region 204 and the device isolation film 206, an etch process is performed with a mask that defines gate regions to etch the hard mask layer, thereby obtaining a hard mask pattern 208.

The active region 204 and the device isolation film 206 are etched using the hard mask pattern 208 as an etch mask to form recesses 210 that define gate regions. The active region 204 and the device isolation film 206 which are located in a recess 210 are additionally etched to form a fin structure 212 where the active region 204 disposed in the bottom of the recess 210 is protruded, rather than the device isolation film 206. A part of the wall oxide film 202 over the sidewalls of the active region 204 is etched from an upper portion of the active region 204. In an embodiment, the etch selectivity of the device isolation film 206 is higher than that of the silicon of the wall oxide film 202 and the active region 204 so that the device isolation film 206 is more deeply etched, and a portion of the wall oxide film 202 remains above the device isolation film 206.

Figure 5:
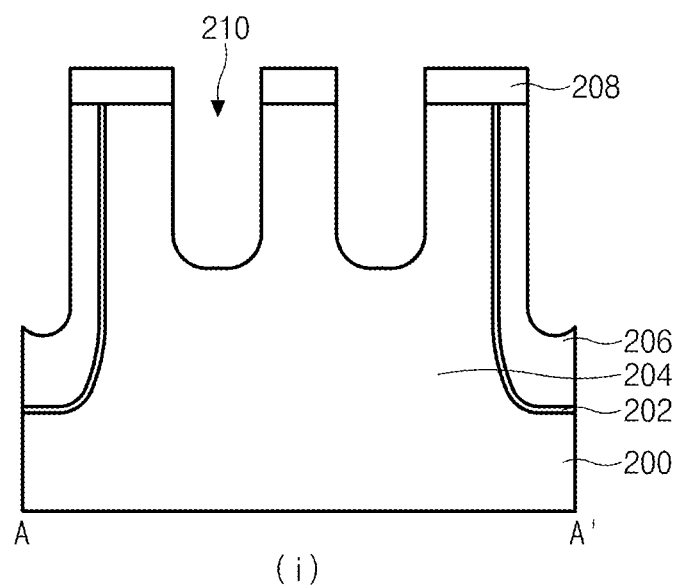
Figure 5:
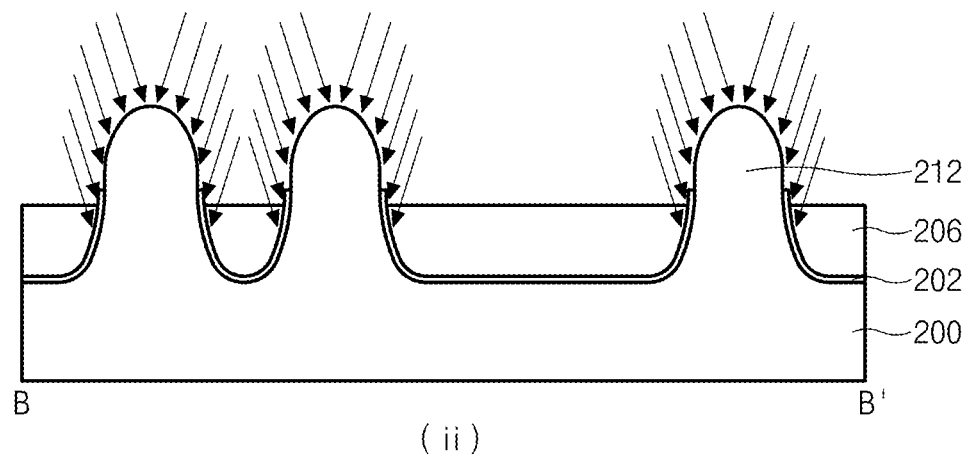

Referring to FIG. 5, a tilt implantation process is performed to implant an inert gas. In an embodiment, the inert gas is a gas that causes damage to affected areas of the semiconductor so that affected areas are more easily removed in a subsequent process. For example, a inert gas such as fluorine (F) gas or argon (Ar) may be implanted into the wall oxide film 202 and portions of the device isolation film 206 adjacent to the active region 204 exposed by the recess 210. As a result, the inert gas is implanted into a portion of the device isolation film 206 adjacent to the active region 204, a portion of the wall oxide film 202 buried in the lower portion of the device isolation film 206, and into the portion of the wall oxide film 202 protruded above the device isolation film 206 in the recess 210. That is, the inert gas is not implanted uniformly into the all exposed surfaces of device isolation film 206 exposed by the recess 210. Rather, a high concentration of the inert gas is implanted around the boundary of the active region 204 and the device isolation film 206 in the recess 210, and other exposed surfaces are not exposed to a high concentration of the inert gas.

Figure 9:
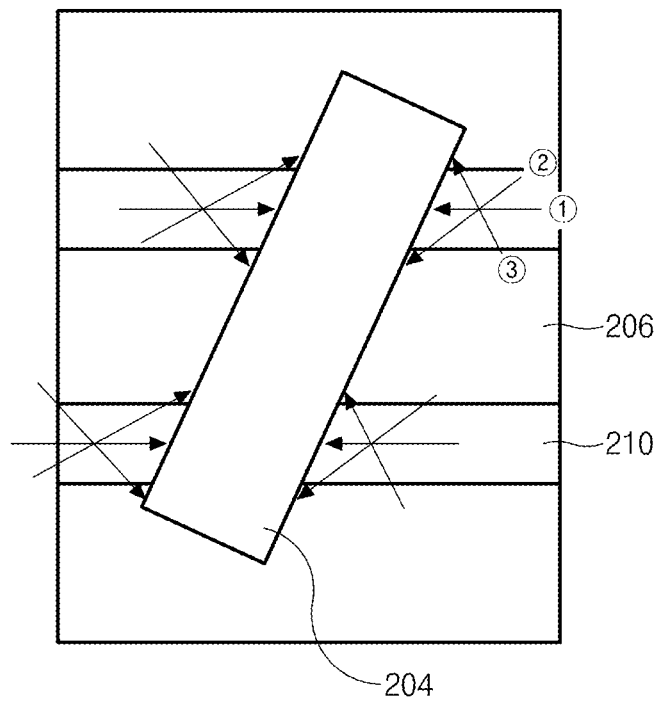
FIG. 9 illustrates implantation of an inert gas according to an embodiment of the present invention.

In an embodiment, as shown by the direction of arrows in FIG. 9, the inert gas may be implanted in the four way twist directions (②③) as well as in the direction Y (①). As a result, the inert gas is implanted into side and bottom surfaces of the recess 210 around the boundary of the active region 204 and the device isolation film 206. In a subsequent cleaning process, when portions of the wall oxide film implanted with the inert gas are removed, the portion of the device isolation film 206 implanted with the inert gas is also removed from to extend the width and the depth of portions of the recess 210 near the boundary of the active region 204 and the device isolation film 206.

Although FIG. 5 only shows that the inert gas is implanted only around the boundary of the active region 204 and the device isolation film 206, in an embodiment the inert gas may be implanted into all surfaces of the device isolation film 206 exposed by the recess 210. However, in such an embodiment, while the width of the recess 210 is extended, the possibility of a short between adjacent gates may be higher during a subsequent gate forming process.

Figure 6:
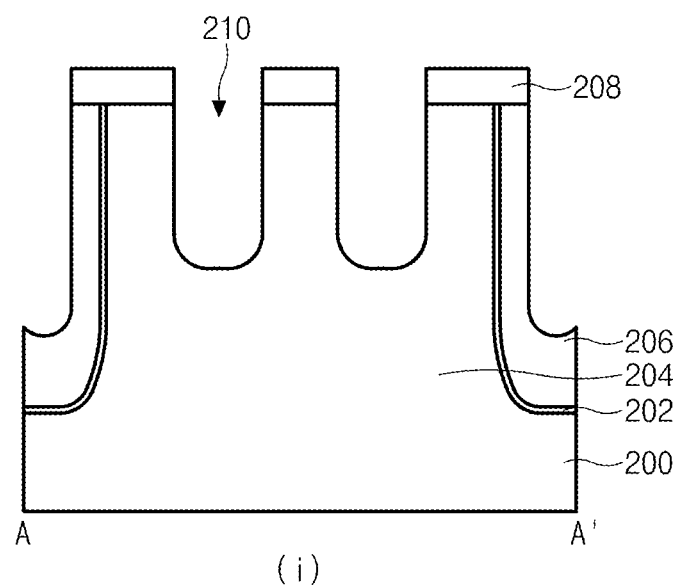
Figure 6:
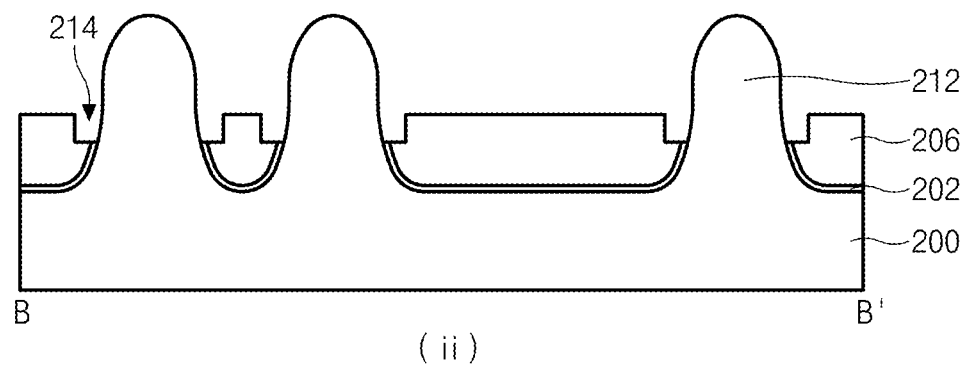

Referring to FIG. 6, a cleaning process is performed on the resultant structure of FIG. 5 to remove portions of the wall oxide film 202 and the device isolation film 206 that were implanted with the inert gas. That is, when a post cleaning process performed after the etch process for forming the fin structure or a pre-cleaning process performed before the process for forming the gate insulating film in the active region 204 protruded with the fin structure is performed, the wall oxide film 202 and the device isolation film 206 implanted with the inert gas are selectively removed to form a moat 214. The moat 214 may have a height ranging from 0 to 300 Å. For example, in various embodiments, the moat may be 50 Å, 100 Å, 200 Å, or 300 Å.

In an embodiment, the moat 214 may be a trench with a width direction orthogonal to the long axis of an active region and a length direction parallel to the long axis of the active region.

Figure 7:
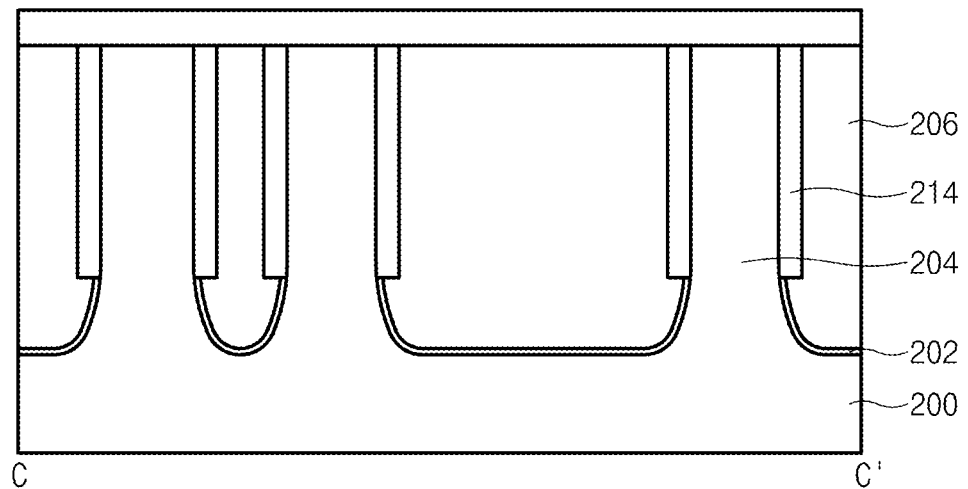

FIG. 7 illustrates a cross-sectional view taken along C-C' in FIG. 1. The device isolation film region implanted with the inert gas by a tilt implantation process as shown in FIG. 9 is etched during a cleaning process to form the moat 214 in the vertical direction. As a result, the width of the recess 210 is extended. In an embodiment, the width of the moat is formed to be larger than the thickness of a gate insulating film formed in a subsequent process. That is, the width of the moat is formed to be large enough to form a portion of a gate as well as the gate insulating film within the moat.

Figure 8:
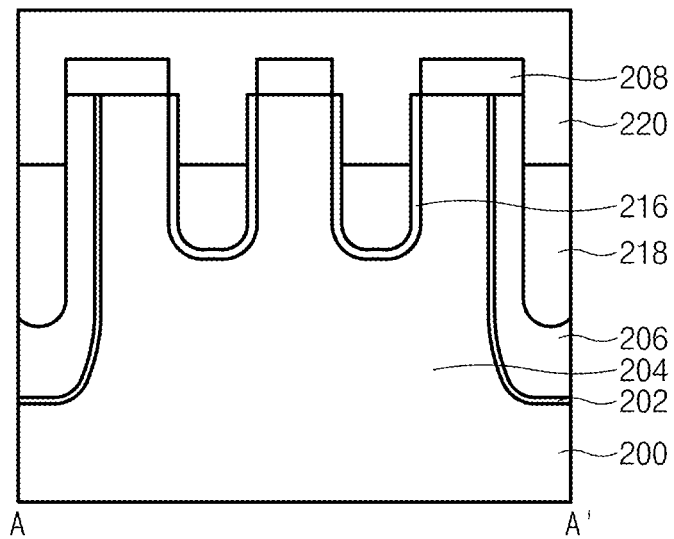
Figure 8:
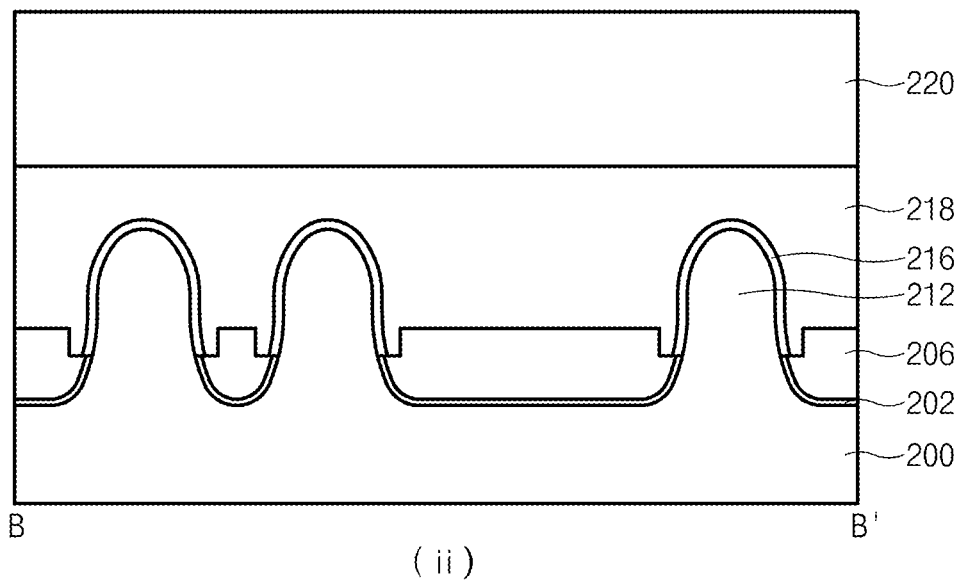

Referring to FIG. 8, a gate insulating film 216 is formed in a portion of the active region 204 exposed by the recess 210 and the moat 214. In the recess 210, the gate insulating film 216 is extended to a lower height than the upper surface of the device isolation film 206. In an embodiment, the gate insulating film 216 is formed over inner surfaces including sidewalls and the lower surface of recesses 210 to a depth below an upper surface of device isolation film 206 in the moat 214. The resulting structure may include a contiguous layer of wall oxide film 202 and gate insulating film 216 formed over surfaces of the substrate 200 and fin structures 212. In an embodiment, a thickness of gate insulating film 216 is greater than a thickness of wall oxide film 202.

In an embodiment, a conductive material for a gate may be formed in the recess 210, and an etch-back process is performed so that the conductive material remains only in the lower portion of the recess 210, thereby obtaining a buried gate 218. That is, the gate 218 is formed in a region within the moat 214, thereby effectively extending the fin width of the transistor.

After an insulating film is formed over the buried gate 218 to bury the recess 210, the insulating film is planarized to form a capping insulating film 220.

Figure 10:
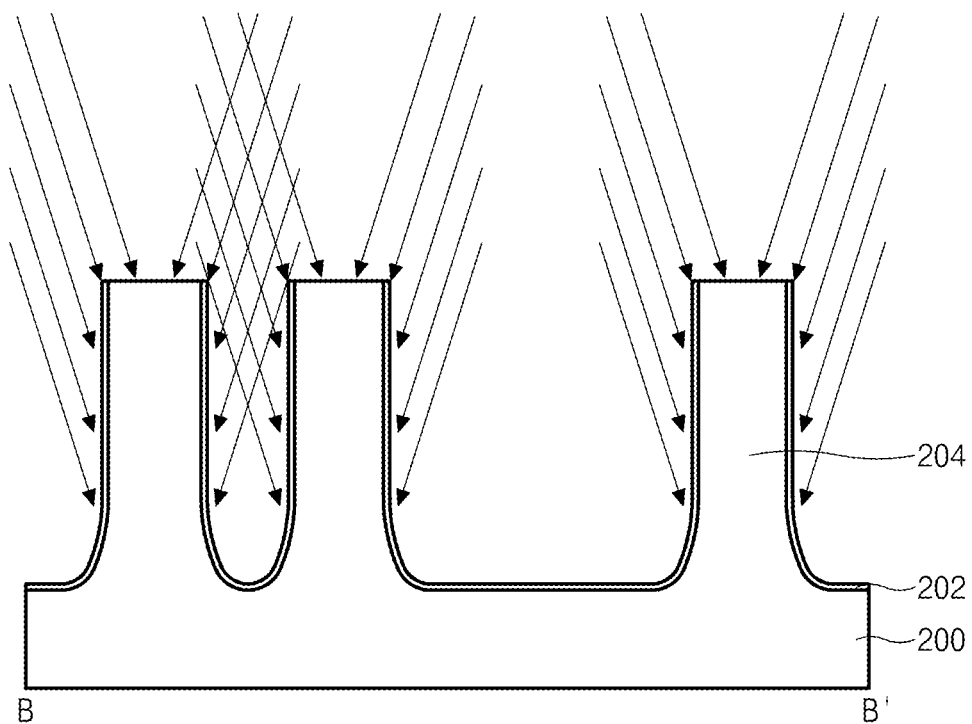
FIGS. 10 to 12 illustrate cross-sectional views of a method of manufacturing a semiconductor device according to another embodiment of the present invention.
Figure 10:
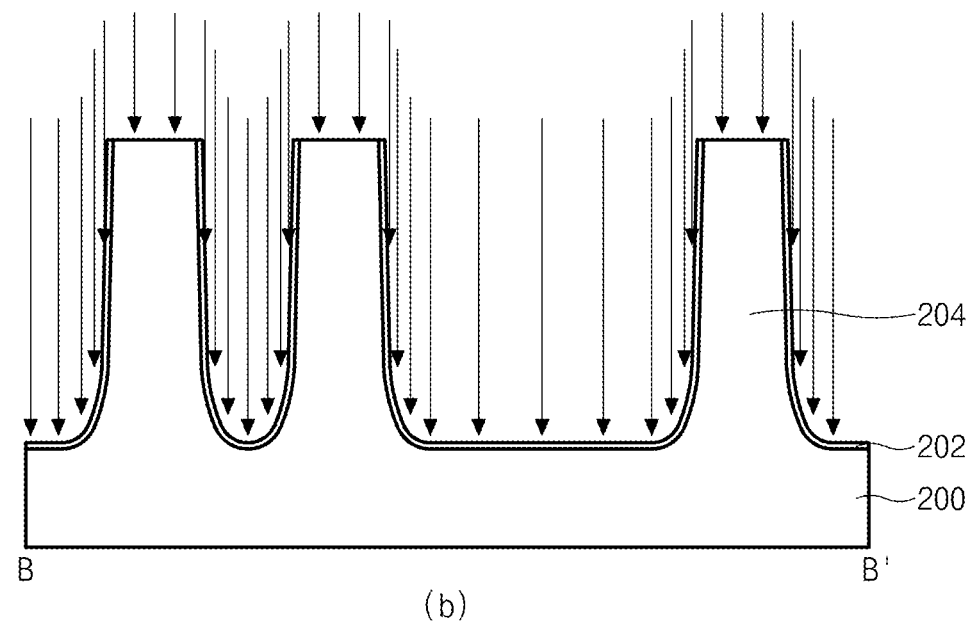
Figure 11:
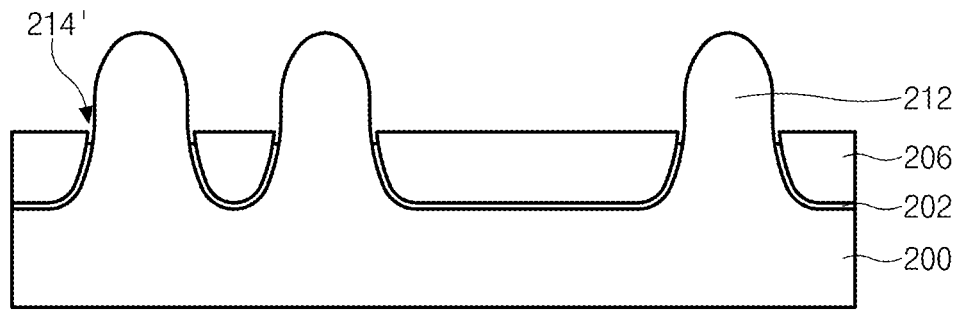
Figure 12:
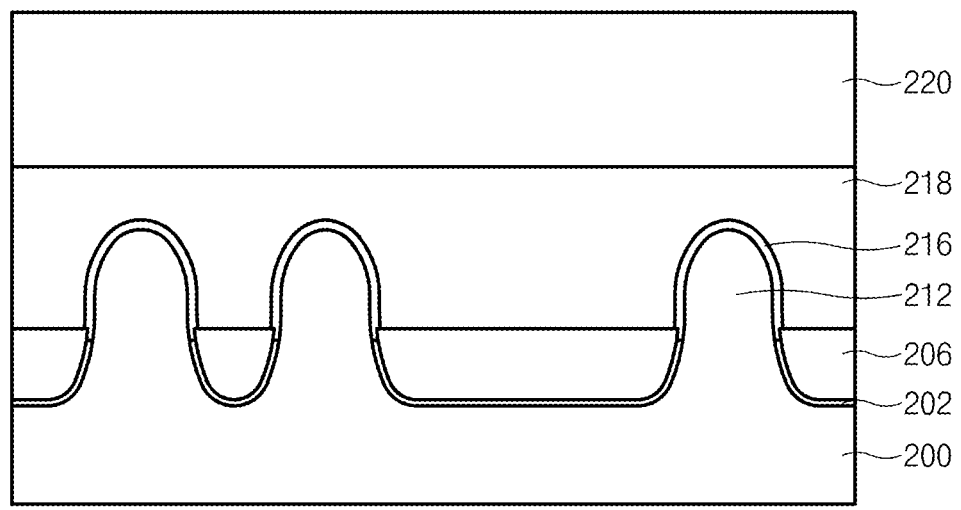

FIGS. 10 to 12 illustrate cross-sectional views of a method of manufacturing a semiconductor device according to another embodiment of the present invention.

In the above-described embodiment of the present invention, the inert gas is implanted after the recess 210 defining the fin structure 212 is formed. However, in the embodiment shown in FIGS. 10 to 12, the inert gas is implanted into the wall oxide film 202 before the device isolation film 206 is formed.

In an embodiment, before the insulating film for device isolation is formed in a trench for device isolation after the wall oxide film 202 is formed as shown in FIG. 3, the inert gas is implanted into the wall oxide film 202 as shown in FIG. 10. The implantation method of the inert gas includes a tilt implantation. That is, by the tilt implantation process performed in the Y direction as shown in (a) of FIG. 10, the inert gas is implanted into portions of the wall oxide film 202 formed over long-axis sidewalls of active region 204. In another embodiment, as shown in (b) of FIG. 10, the inert gas may be implanted in a direction perpendicular to the lower surface of semiconductor substrate 200 without any tilt.

After the device isolation film 206 is formed as shown in FIG. 3, the recess 210 is formed, as shown in FIG. 4, to obtain the fin structure 212 in the gate region. A part of the wall oxide film 202 may remain protruded above the device isolation film 206.

Thereafter, the cleaning process is performed, which may be the same cleaning process discussed above with respect to FIG. 6. However, the structure resulting from the cleaning process conducted on a semiconductor device made with implantation of FIG. 10 has different characteristics from the structure of FIG. 6, as shown in FIG. 11.

Since the inert gas is implanted into the wall oxide film 202, during the cleaning process as shown in FIG. 11, portions of the wall oxide film 202 located on upper surfaces of fin structure 212 and below the upper surface of device isolation film 206 are etched to form a moat 214'.

As shown in FIG. 12, gate insulating film 216 is formed over portions of the active region 204 exposed by the recess 210 and the moat 214'. The moat 214' is filled by the gate insulating film 216. After the gate 218 is formed in the lower portion of the recess 210, capping insulating film 220 is formed over the resulting structure. Although gate 218 may be a buried gate, in another embodiment the gate may be a recessed gate.

In the embodiment shown in FIGS. 10 to 12, the inert gas is not implanted after the recess 210 is formed. Instead, the inert gas is implanted into the wall oxide film 202 before the device isolation film 206 is formed. As a result, a process for extending the width of the recess 210 may not be performed around the boundary of the active region 204 and the device isolation film 206. However, in the embodiment shown in FIGS. 10 to 12, after the recess 210 is formed, the gas implantation process is performed to implant the inert gas into the device isolation film 206 disposed in the side surface of the recess 210, and a cleaning process is performed to partially remove the device isolation film 206 adjacent to the active region 204, so that the width of the recess 210 may be partially extended as shown in (ii) of FIG. 6.

Accordingly, in embodiments of the present invention, a portion of the wall oxide film adjacent to the gate region is removed, and the gate insulating film is formed at the removed place to prevent a parasitic transistor forming through the thin wall oxide film, thereby preventing a threshold voltage of a cell transistor from being lowered.

Also, in embodiments of the present invention, only the width of portions of the gate adjacent to the active region in the gate region is selectively extended to prevent a short phenomenon between adjacent gates while increasing a fin width, thereby improving operating characteristics of the semiconductor device.

The above embodiments of the present invention are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor device, the method comprising:
    etching a semiconductor substrate to form a device isolation trench that defines an active region;
    forming a wall oxide film having a first thickness over inner surfaces of the device isolation trench;
    forming a device isolation film in the device isolation trench;
    etching the active region and the device isolation film to form a recess with a first depth over the active region and a second depth greater than the first depth over the device isolation film;
    forming a moat by removing portions of the wall oxide film adjacent to a portion of the active region exposed by the recess;
    forming a gate insulating film extending into the moat; and
    forming a gate in the recess.

2. A method of manufacturing a semiconductor device, the method comprising:
    etching a semiconductor substrate to form a device isolation trench that defines an active region;
    forming a wall oxide film having a first thickness over inner surfaces of the device isolation trench;
    implanting an inert gas into the wall oxide film;
    forming a device isolation film in the device isolation trench;
    etching the active region and the device isolation film to form a recess with a first depth over the active region and a second depth greater than the first depth over the device isolation film;
    forming a moat by removing portions of the wall oxide film adjacent to a portion of the active region exposed by the recess;
    forming a gate insulating film having a second thickness over portions of the active region exposed by the recess and the moat; and
    forming a gate in the recess.

3. The method according to claim 2, wherein the inert gas includes at least one selected from a group consisting of argon and fluorine.

4. The method according to claim 2, wherein implanting the inert gas comprises performing a tilt implanting process to implant the inert gas into portions of the wall oxide film formed over sidewalls of the device isolation trench.

5. The method according to claim 2, wherein forming the moat further comprises performing a cleaning process after forming the recess to remove a first portion of the wall oxide film disposed over the portion of the active region exposed by the recess, and a second portion of the wall oxide film disposed below an upper surface of the device isolation film.

6. The method according to claim 5, wherein forming the gate insulating film comprises forming an insulating film in the moat.

7. A method of manufacturing a semiconductor device, the method comprising:
    etching a semiconductor substrate to form a device isolation trench that defines an active region;
    forming a wall oxide film having a first thickness over inner surfaces of the device isolation trench;
    forming a device isolation film in the device isolation trench;

etching the active region and the device isolation film to form a recess with a first depth over the active region and a second depth greater than the first depth over the device isolation film;

forming a moat by removing portions of the wall oxide film adjacent to a portion of the active region exposed by the recess;

forming a gate insulating film having a second thickness over portions of the active region exposed by the recess and the moat; and forming a gate in the recess, wherein forming the moat further comprises removing a portion of the device isolation film while removing the portions of the wall oxide film to extend a width of the recess.

8. The method according to claim 7, wherein the removed portion of the device isolation film is adjacent to the portion of the active region exposed by the recess.

9. The method according to claim 8, wherein forming the moat further comprises:

implanting an inert gas into the wall oxide film and the portion of the device isolation film, wherein the portion of the device isolation film is adjacent to the portion of the active region exposed by the recess; and performing a cleaning process on the recess.

10. The method according to claim 9, wherein a width of the moat is larger than the second thickness.

11. The method according to claim 10, wherein forming the gate comprises forming a gate material within the recess and the moat.

12. The method according to claim 9, wherein implanting the inert gas comprises implanting the inert gas into side surfaces and a bottom surface of the recess.

13. The method according to claim 9, wherein the inert gas includes at least one selected from the group consisting of argon and fluorine.

* * * * *